(12) United States Patent
Itai

(10) Patent No.: US 7,943,226 B2
(45) Date of Patent: May 17, 2011

(54) ORGANIC EL PANEL AND METHOD FOR MANUFACTURING ORGANIC EL PANEL

(75) Inventor: Yuichiro Itai, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 492 days.

(21) Appl. No.: 12/049,978

(22) Filed: Mar. 17, 2008

(65) Prior Publication Data
US 2008/0241471 A1   Oct. 2, 2008

(30) Foreign Application Priority Data

Mar. 30, 2007 (JP) ................. 2007-093708

(51) Int. Cl.
*H01J 1/62* (2006.01)
*B05D 5/06* (2006.01)
*B05D 5/12* (2006.01)
*B32B 3/10* (2006.01)

(52) U.S. Cl. ............ 428/138; 428/690; 427/66
(58) Field of Classification Search .......... 428/690, 428/138, 66
See application file for complete search history.

(56) References Cited

FOREIGN PATENT DOCUMENTS

| JP | 7-169567 A | | 7/1995 |
|---|---|---|---|
| JP | 07169567 A | * | 7/1995 |
| JP | 9-148066 A | | 6/1997 |
| JP | 09148066 A | * | 6/1997 |

OTHER PUBLICATIONS

JP 07169567 A machine English translation. Jul. 15, 2010.*
JP 09148066 A machine English translation. Jul. 15, 2010.*

* cited by examiner

*Primary Examiner* — D. Lawrence Tarazano
*Assistant Examiner* — J. L. Yang
(74) *Attorney, Agent, or Firm* — Birch, Stewart, Kolasch & Birch, LLP

(57) ABSTRACT

An organic EL panel including: a substrate; an organic EL device including an anode, an organic EL layer and a cathode layered on the substrate; and a sealing member for sealing the organic EL device on the substrate, and further including a drying agent layer that contacts the organic EL device, and a heat generating layer that contacts the drying agent layer.

13 Claims, 7 Drawing Sheets

ORGANIC EL PANEL AND METHOD FOR MANUFACTURING ORGANIC EL PANEL

CROSS-REFERENCE TO RELATED APPLICATION

This application claims priority under 35 USC 119 from Japanese Patent Application No. 2007-093708, the disclosure of which is incorporated by reference herein.

BACKGROUND OF THE INVENTION

1. Field of the Invention

The present invention relates to an organic electroluminescence (organic EL) display panel provided with an organic EL device and to a method for manufacturing an organic EL panel.

2. Description of the Related Art

In recent years, displays using organic EL devices and the like have been developed. FIG. 7 diagrammatically shows a configuration of an organic EL device 1. An anode 3, an organic EL layer 8 (a hole transport layer 4, a light-emitting layer 5 and an electron transport layer 6), a cathode 7 and so on are formed on a substrate 2 such as glass. In order to protect the organic EL device 1, the organic EL device 1 is sealed with a sealing member (not illustrated) such as glass. Then, the organic EL device 1 is connected to external wiring via a lead-out line (terminal) 9, and when an electric field is applied between the electrodes 3 and 7, the light-emitting layer 5 in a region interposed between the electrodes 3 and 7 comes into an excited state to emit light.

Since a display panel using an organic EL device as above is of a self light emission type, it brings such advantages that a backlight as in a liquid crystal display is not required, that it is possible to reduce the weight and the thickness, and that the viewing angle is wide.

However, the organic EL device is easily deteriorated by water or oxygen and involves such a problem that even when sealed, image pixels degenerate with a lapse of time, resulting in a reduction of the luminance. In order to prevent the deterioration of the organic EL device, it has been proposed to provide a drying agent at the inner side of the sealing member or to provide an oxygen absorbing layer on the organic EL device (see, for example, JP-A Nos. 7-169567 and 9-148066).

SUMMARY OF THE INVENTION

According to an aspect of the invention, there is provided an organic EL panel comprising: a substrate; an organic EL device comprising an anode, an organic EL layer and a cathode layered on the substrate; and a sealing member for sealing the organic EL device on the substrate, and further comprising a drying agent layer that contacts the organic EL device, and a heat generating layer that contacts the drying agent layer.

BRIEF DESCRIPTION OF THE DRAWINGS

Exemplary embodiments of the present invention will be described in detail based on the following figures, wherein.

DETAILED DESCRIPTION OF THE INVENTION

An organic EL panel and a method for manufacturing an organic EL panel according to the present invention are hereunder described with reference to the accompanying drawings.

The organic EL panel according to the invention comprises: a substrate; an organic EL device comprising an anode, an organic EL layer and a cathode layered on the substrate; and a seating member for sealing the organic EL device on the substrate, and further comprises a drying agent layer that contacts the organic EL device, and a heat generating layer that contacts the drying agent layer. Since a drying agent layer is disposed in the vicinity of the organic EL device and further a heat generating layer is provided in this manner, for example, the drying agent layer in the vicinity of the organic EL device can be kept in an activated state capable of positively absorbing oxygen and water by heating of the heat generating layer at the manufacture of an organic EL panel.

First Embodiment

Figure 1:
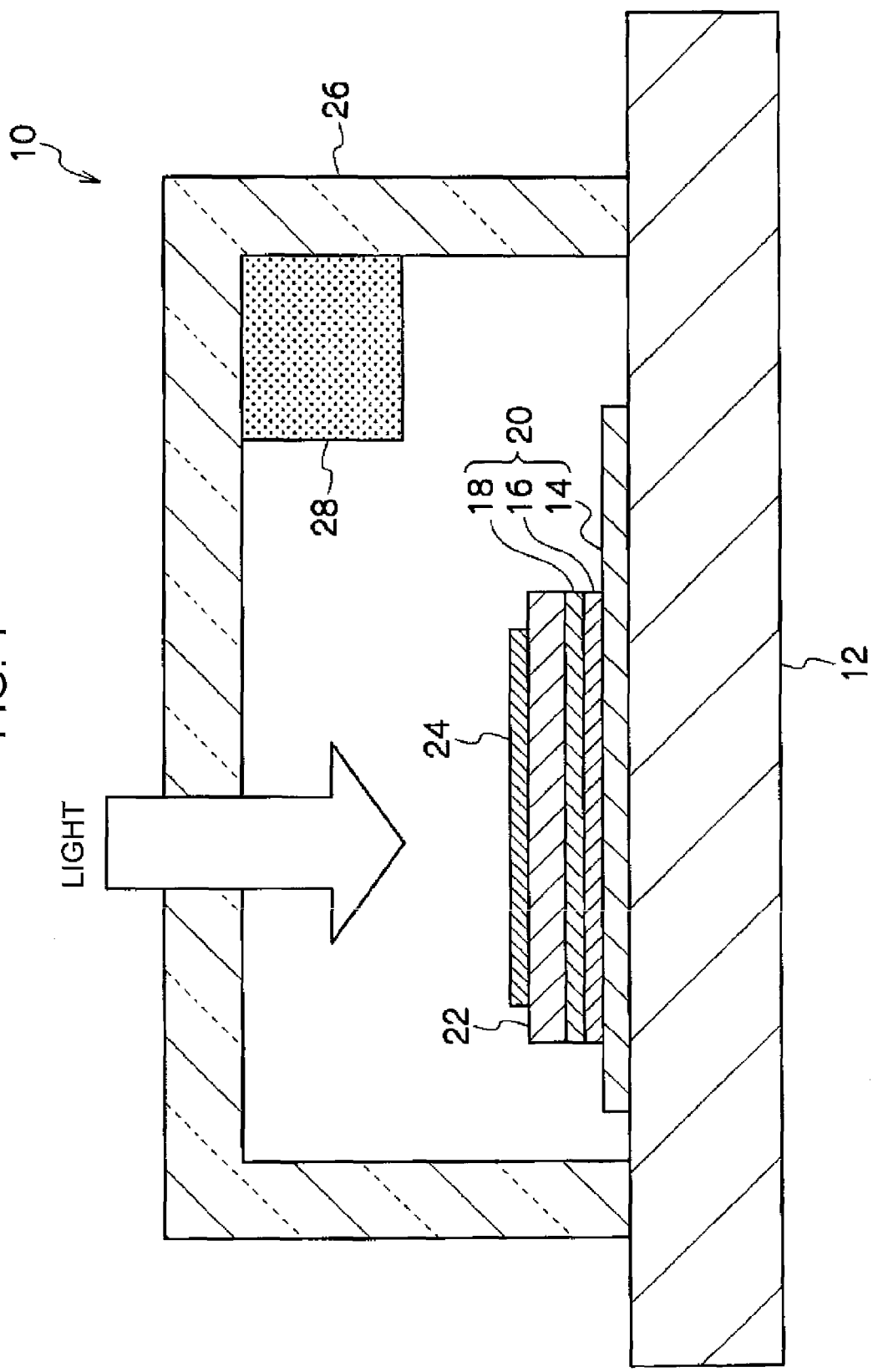
FIG. 1 is a diagrammatic view showing an example (first embodiment) of an organic EL panel according to the present invention.

FIG. 1 diagrammatically illustrates an example (first embodiment) of an organic EL panel according to the invention. This organic EL panel 10 includes a transparent substrate 12, an organic EL device 20, a sealing member 26 and the like.

The organic EL device 20 includes an anode 14, an organic EL layer 16 and a cathode 18 successively layered on the substrate 12. Furthermore, a drying agent layer 22 and a heat generating layer 24 are successively layered on the cathode 18. In FIG. 1, a diaphragm, an insulating film and the like are omitted.

<Substrate>

The substrate 12 is not particularly limited, and a known substrate which has strength sufficient to support the organic EL device and the like and light transmittance may be used. Specific examples include inorganic materials such as Yttria-Stabilized Zirconia (YSZ) and glass, and organic materials such as polyester, e.g. polyethylene terephthalate, polybutylene phthalate, and polyethylene naphthalate, and also polystyrene, polycarbonate, polyether sulfone, polyacrylate, polyimide, polycycloolefin, norbornene resins, and poly (chlorotrifluoroethylene).

For example, when glass is used as the substrate 12, a non-alkali glass is preferred to reduce elution of ions from the glass. When soda lime glass is used, it is preferred that a barrier coat such as silica be provided on the glass.

Further, when a substrate made of organic material is used, it is preferred that the substrate is excellent in terms of heat resistance, dimensional stability, resistance to solvents, electrical insulating properties, and processability. In particular, when a plastic substrate is used, it is preferred that a moisture permeation preventing layer or a gas barrier layer be provided on one surface or both surfaces of the substrate 12 to inhibit the permeation of moisture or oxygen. Inorganic substances such as silicon nitride and silicon oxide can be advantageously used as materials for the moisture permeation preventing layer or gas barrier layer. The moisture permeation preventing layer or gas barrier layer can be formed, for example, by a high-frequency sputtering method.

When a thermoplastic substrate is used, it may be further provided, if necessary, with a hard coat layer, an undercoat layer, or the like.

The shape, structure, and size of the substrate 12 are not particularly limited and can be appropriately selected according to the application, object, and the like of the organic EL panel 10. Generally, from the standpoint of the handling property and easiness of forming the organic EL device 20, it is preferred that the substrate 12 have a plate-like shape. The structure of the substrate 12 may be a monolayer structure or a laminated structure. Further, the substrate 12 may be composed of a single member or two or more members.

The substrate 12 may be colorless and transparent or colored and transparent, but from the standpoint of enabling the prevention of scattering and attenuation of the light emitted from the organic EL device 20, it is preferred that the substrate be colorless and transparent.

<Organic EL Device>

The organic EL device 20 is formed as a light emitting device on the substrate 12. The layer structure of the organic EL device 20 is not particularly limited, provided that the light emitting device has the organic EL layer 16 between a pair of electrodes, the anode 14 and the cathode 18, laminated in the thickness direction of the substrate 12. Specific examples of the layer structure are listed below. However, in the invention, the layer structure of the device 20 is not limited to these structures and can be appropriately determined according to the object or the like.

Anode/Light emitting layer/Cathode.
Anode/Hole transport layer/Light emitting layer/Electron transport layer/Cathode.
Anode/Hole transport layer/Light emitting layer/Blocking layer/Electron transport layer/Cathode.
Anode/Hole transport layer/Light emitting layer/Blocking layer/Electron transport layer/Electron injection layer/Cathode.
Anode/Hole injection layer/Hole transport layer/Light emitting layer/Blocking layer/Electron transport layer/Cathode.
Anode/Hole injection layer/Hole transport layer/Light emitting layer/Blocking layer/Electron transport layer/Electron injection layer/Cathode.

<Anode and Lead-Out Line>

For example, the anode 14 is formed as a stripe on the substrate 12, and a lead-out line is formed at one end of the anode.

The shape, structure, and size of the anode 14 are not particularly limited and can be appropriately selected from those of known electrode materials according to the application, object or the like of the organic EL panel 10, provided that the anode have a function of an electrode for supplying holes to the organic EL layer 16. However, from the standpoint of properties of the organic EL device 20, it is preferred that at least one electrode of the anode 14 and the cathode 18 be transparent; usually, the transparent anode 14 is formed.

Examples of materials that can be advantageously used for constituting the anode 14 include metals, alloys, metal oxides, electrically conductive compounds, or mixtures thereof. Specific examples include electrically conductive metal oxides such as tin oxide doped with antimony, fluorine, or the like (ATO, FTO), tin oxide, zinc oxide, indium oxide, indium tin oxide (ITO), and indium zinc oxide (IZO); metals such as gold, silver, chromium, and nickel; mixtures or laminates of these metals and electrically conductive metal oxides; inorganic conductive substances such as copper iodide and copper sulfide; organic conductive materials such as polyaniline, polythiophene, and polypyrrole; and laminates of these and ITO. The preferred among them are electrically conductive metal oxides, and from the standpoint of productivity, high conductivity, transparency, and the like, ITO is especially preferred.

Examples of methods for forming the anode 14 include wet methods such as printing and coating, physical methods such as vacuum deposition, sputtering, and ion plating, and chemical methods such as CVD and plasma CVD. The anode 14 can be formed on the substrate 12 by a method that is appropriately selected with consideration of compatibility with the material for forming the anode 14. For example, when ITO is selected as the anode material, the anode 14 can be formed by DC or high-frequency sputtering, vacuum deposition, ion plating, or the like.

The position for forming the anode 14 is not particularly limited and can be appropriately selected according to the application, object or the like of the organic EL panel 10. Thus, the anode 14 may be formed on the whole of one of the surfaces of the substrate 12 or may be partially formed thereon Patterning in the formation of the anode 14 may be performed by chemical etching based on photolithography or the like or by physical etching employing a laser or the like. Further, vacuum deposition, sputtering or the like may be performed using a mask, or the patterning may be performed by a lift-off method or a printing method.

The lead-out line for the anode 14 can be formed by the same method and using the same material as those employed to form the anode 14, and the lead-out line to be connected to the anode 14 may be formed simultaneously with the formation of the anode 14. In this process, the lead-out line for the cathode 18 may be formed at the same time.

The thickness of the anode 14 and the lead-out line can be appropriately selected according to the material constituting the anode 14 and the like and cannot be determined exclusively. Usually, the thickness is about 10 nm to 50 µm, preferably 50 nm to 20 µm.

Further, the electric resistance of the anode 14 and lead-out line is preferably $10^3 \Omega/\square$ or less, more preferably $10^2 \Omega/\square$ or less in order to supply holes reliably to the organic EL layer 16.

When the transparent anode 14 is employed, it may be colorless and transparent or colored and transparent. In order to take out light from the transparent anode 14 side, the light transmittance of the anode is preferably 60% or more, more preferably 70% or more. Details for the transparent anode 14 are explained in "New Development of Transparent Electrode Film", supervised by Yutaka Sawada, published by CMC (1999), and matters described therein can be also applied to the invention. For example, when a plastic substrate 12 with a low heat resistance is used, a transparent anode which is deposited at a low temperature of 150° C. or less using ITO or IZO is preferred.

<Organic EL Layer>

The organic EL device 20 has the organic EL layer 16 containing at least a light emitting layer between the anode 14 and the cathode 18. Examples of layers other than the light emitting layer that constitute the organic EL layer 16 include, as described hereinabove, a hole transport layer, an electron transport layer, a charge blocking layer, a hole injection layer, and an electron injection layer. In a preferred layer structure, a hole transport layer, a light emitting layer, and an electron transport layer are laminated in this order from the anode 14 side. Further, a charge blocking layer and the like may be present, for example, between the hole transport layer and the light emitting layer or between the light emitting layer and the electron transport layer. A hole injection layer may be present between the anode 14 and the hole transport layer, and an electron injection layer may be present between the cathode 18 and the electron transport layer. Further, each layer may be divided into plural secondary layers.

Each of these layers constituting the organic EL layer 16 can be advantageously formed by a dry deposition method such as vapor deposition and sputtering, or by a transfer method, a printing method, and the like.

—Light Emitting Layer—

The light emitting layer has a function of receiving holes from the anode 14, hole injection layer, or hole transport layer and receiving electrons from the cathode 18, electron injection layer, or electron transport layer when an electric field is applied thereto, providing sites for recombination of the holes and electrons, and emitting light.

The light emitting layer may be made up of only a light emitting material, or may be made up as a layer of mixture of a host material and a light emitting material. Further, the light emitting layer may also contain a material that has no charge transport capability and does not emit light. The light emitting layer may include one layer or two or more layers, and each layer may emit light of different color.

The light emitting material may be a fluorescence light emitting material or a phosphorescence light emitting material, and may be doped with one or two or more dopants.

Examples of fluorescence light emitting material include a variety of metal complexes represented by metal complexes of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensation aromatic compounds, perynone derivatives, oxadiazole derivatives, oxazine derivatives, aldazine derivatives, pyridine derivatives, cyclopentadiene derivatives, bis-styrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, and 8-quinolinol derivatives and metal complexes of pyrromethene derivatives; polymer compounds such as polythiophene, polyphenylene, and polyphenylene vinylene; and compounds of organosilane derivatives.

Examples of phosphorescence light emitting materials include complexes containing a transition metal atom or a lanthanoid atom.

The transition metal atoms are not particularly limited, and preferred examples thereof include ruthenium, rhodium, palladium, tungsten, rhenium, osmium, iridium, and platinum, and more preferred examples include rhenium, iridium, and platinum.

Examples of lanthanoid atoms include lanthanum, cerium, praseodymium, neodymium, samarium, europium, gadolinium, terbium, dysprosium, holinium, erbium, thulium, ytterbium, and lutetium. Among these lanthanoid atoms, neodyinium, europium, and gadolinium are preferred.

Examples of ligands of the complexes are described in G. Wilkinson et al., "Comprehensive Coordination Chemistry", Pergamon Press Co., published in 1987; H. Yersin, "Photochemistry and Photophysics of Coordination Compounds", Springer-Verlag, published in 1987; Akio Yamamoto "Organic metal chemistry—basic and application—", Shokabo Publishing Co., Ltd., published in 1982; and the like.

Specific examples of preferred ligands include halogen ligands (preferably chlorine ligand), nitrogen-containing heterocyclic ligands (for example, phenylpyridine, benzoquinoline, quinolinol, bipyridyl, and phenanthroline), diketone ligands (for example, acetylacetone), carboxylic acid ligands (for example, acetic acid ligand), carbon monoxide ligand, isonitrile ligand, and cyano ligand; among them, nitrogen-containing heterocyclic ligands are more preferred. The above-described complexes may have one transition metal atom in a compound or may be the so-called polynuclear complexes that have two or more transition metal atoms. Different metal atoms may be contained simultaneously.

The phosphorescence light emitting material is contained in the light emitting layer preferably at 0.1 to 40% by mass, more preferably at 0.5 to 20% by mass.

The host material contained in the light emitting layer is preferably a charge transporting material. The host material of one kind or host materials of two or more kinds may be employed. For example, a composition can be used in which a host material with electron transport ability and a host material with a hole transport ability is mixed.

Specific examples of host materials include materials having a carbazole skeleton, a diarylamine skeleton, a pyridine skeleton, a pyrazine skeleton, a triazine skeleton, or an arylsilane skeleton, or materials listed in the below-described sections relating to the hole injection layer, the hole transport layer, the electron injection layer, and the electron transport layer.

The thickness of the light emitting layer is not particularly limited, and usually the thickness is preferably 1 nm to 500 nm, more preferably 5 nm to 200 nm, and even more preferably 10 nm to 100 nm.

—Hole Injection Layer and Hole Transport Layer—

The hole injection layer and the hole transport layer function to receive holes from the anode 14 or anode side and transport the holes to the cathode side. The hole injection layer and the hole transport layer preferably contain any of metal complexes of various kinds represented by Ir complexes having as a ligand a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound, an organosilane compound, carbon, phenylazole, or phenylazine.

From the standpoint of lowering the driving voltage, it is preferred that the thickness of the hole injection layer and the hole transport layer be 500 nm or less for each layer.

The thickness of the hole transport layer is preferably 1 nm to 500 nm, more preferably 5 nm to 200 nm, and even more preferably 10 nm to 200 nm. The thickness of the hole injection layer is preferably 0.1 nm to 200 nm, more preferably 0.5 nm to 200 nm, and even more preferably 1 nm to 200 nm.

Each of the hole injection layer and the hole transport layer may have a monolayer structure comprising one, or two or more of the above-described materials, or a multilayer structure comprising plural layers of identical or dissimilar compositions.

—Electron Injection Layer and Electron Transport Layer—

The electron injection layer and the electron transport layer function to receive electrons from the cathode 18 or cathode side and transport the electrons to the anode side. Specifically, the electron injection layer and the electron transport layer preferably contain any of metal complexes of various kinds represented by metal complexes of a triazole derivative, an oxazole derivative, an oxadiazole derivative, an imidazole derivative, a fluorenone derivative, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, an aromatic tetracarboxylic acid anhydride of naphthalene or perylene, a phthalocyanine derivative, and an 8-quinolinol derivative, and a metal phthalocyanine, and metal complexes having a benzoxazole, or benzothiazole as a ligand, and an organosilane derivative.

From the standpoint of lowering the driving voltage, it is preferred that the thickness of the electron injection layer and the electron transport layer be 500 nm or less for each layer.

The thickness of the electron transport layer is preferably 1 nm to 500 nm, more preferably 5 nm to 200 nm, and even more preferably 10 nm to 100 nm. The thickness of the electron injection layer is preferably 0.1 nm to 200 nm, more preferably 0.2 nm to 100 nm, and even more preferably 0.5 nm to 50 nm.

Each of the electron injection layer and the electron transport layer may have a monolayer structure comprising one, or two or more of the above-described materials, or a multilayer structure comprising plural layers of identical or dissimilar compositions.

—Hole Blocking Layer—

The hole blocking layer has a function of preventing the holes that have been transported from the anode side to the light emitting layer from penetrating to the cathode side. The hole blocking layer adjacent to the light emitting layer at the cathode side can be provided.

Examples of organic compounds for constituting the hole blocking layer include aluminum complexes such as BAlq, triazole derivatives, and phenanthroline derivatives such as BCP, and the like.

The thickness of the hole blocking layer is preferably 1 nm to 500 nm, more preferably 5 nm to 200 nm, and even more preferably 10 nm to 100 nm.

The hole blocking layer may have a monolayer structure comprising one, or two or more of the above-described materials, or a multilayer structure comprising plural layers of identical or dissimilar compositions.

<Cathode and Lead-Out Line>

The cathode 18 may be formed as a stripe on the organic EL layer 16 so as to intersect with the anode 14.

Usually, the cathode 18 has a function of an electrode for supplying electrons to the organic EL layer 16 and the shape, structure, and size of the cathode 18 are not particularly limited and can be appropriately selected from those of the known electrode materials according to the application, object or the like of the organic EL panel 10. Examples of materials for constituting the cathode 18 include metals, alloys, metal oxides, electrically conductive compounds, and mixtures thereof. Specific examples include alkali metals (for example, Li, Na, K, Cs and the like), alkaline earth metals (for example, Mg, Ca and the like), gold, silver, lead, aluminum, sodium-potassium alloys, lithium-aluminum alloys, magnesium-silver alloys, indium, rare earth metals such as ytterbium, and the like. These materials may be used individually, but from the standpoint of improving both the stability and the electron injection ability, two or more thereof can be advantageously used together.

Among the above-mentioned materials for constituting the cathode 18, from the standpoint of electron injection ability, alkali metals and alkaline earth metals are preferred, and from the standpoint of excellent storage stability, materials containing aluminum as the main component are preferred. Examples of materials containing aluminum as the main component include pure aluminum, alloys of aluminum and 0.01 to 10% by mass alkali metal or alkaline earth metal, and mixtures thereof (for example, lithium-aluminum alloys, magnesium-aluminum alloys and the like).

Materials for the cathode 18 are explained in detail in JP-A Nos. 2-15595 and 5-121172, and the materials described in these open publications can be also applied to the invention.

The method for forming the cathode 18 is not particularly limited and the cathode 18 can be formed according to known methods. For example, the cathode 18 can be formed by a method that is appropriately selected with consideration of compatibility with the material for forming the cathode from among wet methods such as printing and coating, physical methods such vacuum deposition, sputtering, and ion plating, and chemical methods such as CVD and plasma CVD. For example, when a metal or the like is selected as the cathode material, the cathode 18 can be formed by sputtering one metal, or two or more metals in a simultaneous or consecutive mode.

Patterning in the formation of the cathode 18 may be performed by chemical etching based on photolithography or the like or by physical etching employing a laser or the like. Further, vacuum deposition or sputtering may be performed using a mask, or the patterning may be performed by a lift-off method or a printing method.

The lead-out line for the cathode can be formed by the same method and using the same material as those used to form the cathode 18, but the lead-out line can be also formed simultaneously with the formation of the cathode 18.

The formation position of the cathode 18 is not particularly limited and the cathode 18 may be formed on the whole of the organic EL layer 16 or may be partially formed thereon.

A dielectric layer composed of an alkali metal or alkaline earth metal fluorides, oxides, and the like may be formed to have a thickness of 0.1 nm n to 5 nm between the cathode 18 and the organic EL layer 16. The dielectric layer can be also considered as a kind of an electron injection layer. The dielectric layer can be formed, for example, by vacuum deposition, sputtering, ion plating or the like.

The thickness of the cathode 11 can be appropriately selected according to the material constituting the cathode 18 and cannot be determined exclusively. Usually, the thickness is about 10 nm to 5 μm, preferably 50 nm to 1 μm.

The cathode 18 may be transparent or opaque. In the case of the transparent cathode 18, the cathode 18 can be formed by providing a thin film with a thickness of 1 nm to 10 nm using the material for the cathode 18, and laminating thereon a transparent electrically conductive material such as ITO and IZO in particular.

<Drying Agent Layer>

In the organic EL panel 10 of the invention, the drying agent layer 22 is provided at a position in contact with the organic EL device 20. In the organic EL panel 10 as illustrated in FIG. 1, the drying agent layer 22 is formed on the cathode 18 of the organic EL device 20.

As the drying agent layer 22, any material which is chemically adsorptive or physically adsorptive may be used so far as even when it adsorbs water and absorbs moisture, it keeps the solid state. Examples of the material to form the drying agent layer 22 include alkali metal oxides, alkaline earth metal oxides, sulfates, metal halides, perchlorates, organic materials, molecular sieve, zeolite and phosphorus pentoxide.

Examples of the foregoing alkali metal oxides include sodium oxide ($Na_2O$) and potassium oxide ($K_2O$). Examples of the foregoing alkaline earth metal oxides include calcium oxide (CaO), barium oxide (BaO) and magnesium oxide (MgO).

Examples of the foregoing sulfates include lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) and nickel sulfate ($NiSO_4$); and anhydrous salts thereof are especially suitable.

Examples of the foregoing metal halides include calcium chloride ($CaCl_2$), lithium chloride (LiCl), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), calcium bromide ($CaBr_2$), cerium bromide ($CeBr_3$), selenium bromide ($SeBr_4$), vanadium bromide ($VBr_2$), magnesium bromide ($MgBr_2$), barium iodide ($BaI_2$) and magnesium iodide ($MgI_2$); and anhydrous salts thereof are especially suitable.

Examples of the foregoing perchlorates include barium perchlorate ($Ba(ClO_4)_2$) and magnesium perchlorate ($Mg(ClO_4)_2$); and anhydrous salts thereof are especially suitable.

A method for forming the drying agent layer 22 is not particularly limited so far as the drying agent layer 22 can be fabricated so as to be in contact with the organic EL device 20 by using the foregoing material having moisture absorption properties. Examples thereof include a wet method (for example, a printing method and a coating method), a physical method (for example, a vacuum vapor deposition method, a sputtering method and an ion plating method) and a chemical method (for example, CVD and a plasma CVD method).

The thickness of the drying agent layer 22 can be properly chosen depending upon the material to form the drying agent layer 22 and cannot be exclusively defined. It is usually from about 1 nm to 1 mm, and preferably from 10 nm to 1 μm.

The drying agent layer 22 may have a structure in which two or more kinds of drying agents are layered. When the drying agent layer 22 has a multilayer structure, different performances of drying agents including moisture absorption capacity, moisture absorption power and moisture absorption rate can be combined. For example, there is an advantage that when a drying agent having small moisture absorption capacity but large moisture absorption rate, which is used for initial drying after the manufacture, is combined with a drying agent having small moisture rate but large moisture capacity, which is used for long-term preservation, it is possible to reduce the initial deterioration and the long-term deterioration.

<Heat Generating Layer>

In the invention, the heat generating layer 24 is formed so as to be in contact with the drying agent layer 22. The heat generating layer 24 may be formed of a material capable of generating heat upon energy application from the outside. For example, a material capable of generating heat when irradiated with electromagnetic waves such as light can be used. Specifically, the heat generating layer 24 can be formed of a metal vapor deposited film of Cr, etc., a layer containing carbon black, Chrome Black (chromium oxide) or a semiconductor capable of absorbing ultraviolet rays or the like to generate heat, or a layer containing an infrared absorbing dye or the like as a light-heat converting material.

A method for forming the heat generating layer 24 is not particularly limited so far as the heat generating layer 24 can be fabricated so as to be in contact with the dying agent layer 22 by using the foregoing material. Examples thereof include a wet method (for example, a printing method and a coating method), a physical method (for example, a vacuum vapor deposition method, a sputtering method and an ion plating method) and a chemical method (for example, CVD and a plasma CVD method).

The thickness of the heat generating layer 24 can be properly chosen depending upon the material to form the heat generating layer 24 and cannot be exclusively defined. It is usually from about 1 nm to 10 μm, and preferably from 10 nm to 1 μm.

<Sealing>

After forming the organic EL device 20, the drying agent layer 22 and the heat generating layer 24, sealing is performed. The sealing member 26 is not particularly limited so far as it has high airtightness, and a known sealing material composed of glass, a resin film, a metal or the like can be used as the sealing member 26. For example, an adhesive such as an ultraviolet ray-curable epoxy resin is coated on the surroundings of the organic EL device on the substrate 12, and the sealing member 26 is stuck to seal the organic EL device 20.

By filling an inert gas or an inert liquid inside the sealing member 26, it is possible to inhibit the deterioration of the organic EL device 20 due to oxygen or water. Examples of the inert gas include argon and nitrogen; and examples of the inert liquid include paraffins, liquid paraffins, fluorine solvents (for example, perfluoroalkanes, perfluoroamines and perfluoroethers), chlorine solvents and silicone oils.

When the adhesive for sealing is dried, the inside of the sealing member 26 becomes airtight, whereby it is possible to prevent the organic EL device 20 from coming into contact with oxygen or water in air. However, it is impossible to completely prevent the penetration of water or the like into the inside of the sealing member 26, and in particular, when a resin substrate is used as the supporting substrate 12, oxygen or water may penetrate therethrough. Then, in addition to the drying agent layer (first drying agent layer) 22 that contacts the organic EL device 20, it is favorable to provide another drying agent layer (second drying agent layer) 28 that is separate from the organic EL device 20 inside the sealing member 26.

As this second drying agent layer 28, any material which is chemically adsorptive or physically adsorptive may be used so far as it adsorbs water existing inside the sealing member 26 and keeps the solid state, and the materials as exemplified with respect to the first drying agent layer 22 can be used. However, for the purpose of positively absorbing water released from the first drying agent layer 22 on the second drying agent layer 28, it is favorable that the second drying agent layer 28 has higher moisture absorption ability than the first drying agent layer 22. The position and shape of the second drying agent layer 28 are not particularly limited so far as the second drying agent layer 28 is separate from the organic EL device 20 inside the sealing member 26. The second drying agent layer 28 may be provided on the inside of a side wall of the sealing member 26 as illustrated in FIG. 1, and alternatively, the second drying agent layer 28 may be located opposite to the organic EL device 20 or may be provided on the substrate 12 in the surroundings of the organic EL device 20.

By performing sealing, the organic EL panel 10 having a configuration as illustrated in FIG. 1 can be obtained. Furthermore, by connecting an external wiring to each of the electrodes 14 and 18 and applying an electric field between the electrodes, it is possible to achieve light emission of the organic EL layer 16 between the electrodes. With respect to a drive method of the organic EL device 20, drive methods described in, for example, JP-A Nos. 2-148687, 6-301355, 5-29080, 7-134558, 8-234685 and 8-241047, Japanese Patent No. 2784615 and U.S. Pat. Nos. 5,828,429 and 6,023,308 can be applied.

In the foregoing organic EL panel 10, since the heat generating layer 24 is provided so as to be in contact with the drying agent layer 22, the heat generating layer 24 performs light-heat conversion to generate heat by light irradiation or light emission of the organic EL device 20. The drying agent layer 22 is able to effectively perform moisture absorption of water in the organic EL device 20 due to the heat from the heat generating layer 24, and furthermore, the water which has been once absorbed in the drying agent layer 22 is released and absorbed in the drying agent layer 28 on a side of the sealing member. In this way, the water absorbing power of the first drying agent layer 22 is recovered, whereby water can be positively absorbed from the side of the device 20. According to such an action, in the organic EL device 20, the degeneration of image pixels due to water is effectively inhibited, thereby enabling realization of a long life.

It may also be thought that water is absorbed in the organic EL device 20 until sealing after the formation of the organic EL device 20. Then, it is favorable to cause the heat generating layer 24 to generate heat in order to reduce water contained in the organic EL device 20 prior to initial light emission of the organic EL device 20.

Since the drying agent layer 22 and the heat generating layer 24 are formed on the organic EL device 20, for example, after sealing, light is irradiated towards the heat generating layer 24 to generate heat. According to this, water absorbed from the organic EL device 20 into the first drying agent layer 22 is positively released and absorbed in the second drying agent layer 28.

As mentioned above, when the heat generating layer 24 is caused to generate heat to reduce water contained in the organic EL device 20 prior to initial light emission of the organic EL device 20, it is possible to effectively inhibit so-called initial failure or the generation of dark spots.

Figure 2:
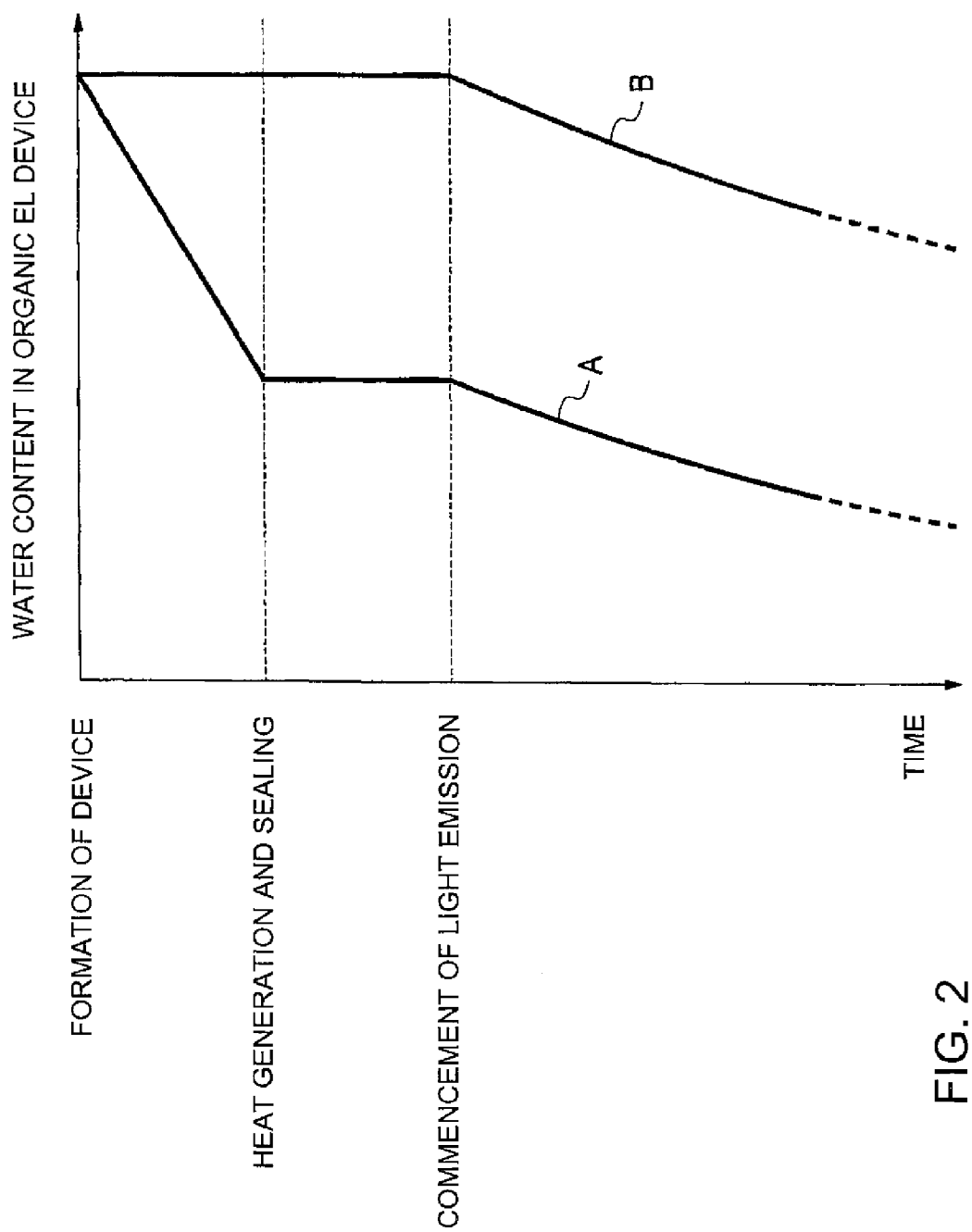
FIG. 2 is a view modeling a change of the water content of an organic EL device.

The water content in the organic EL device 20 can also be reduced by causing the heat generating layer 24 to generate heat prior to sealing. FIG. 2 is a view modeling a change of the water content in the organic EL device 20. In FIG. 2, Line A shows the case where the drying agent layer 22 and the heat generating layer 24 are provided; and Line B shows the case where only the drying agent layer 22 or the heat generating layer 24 is provided.

Figure 6:
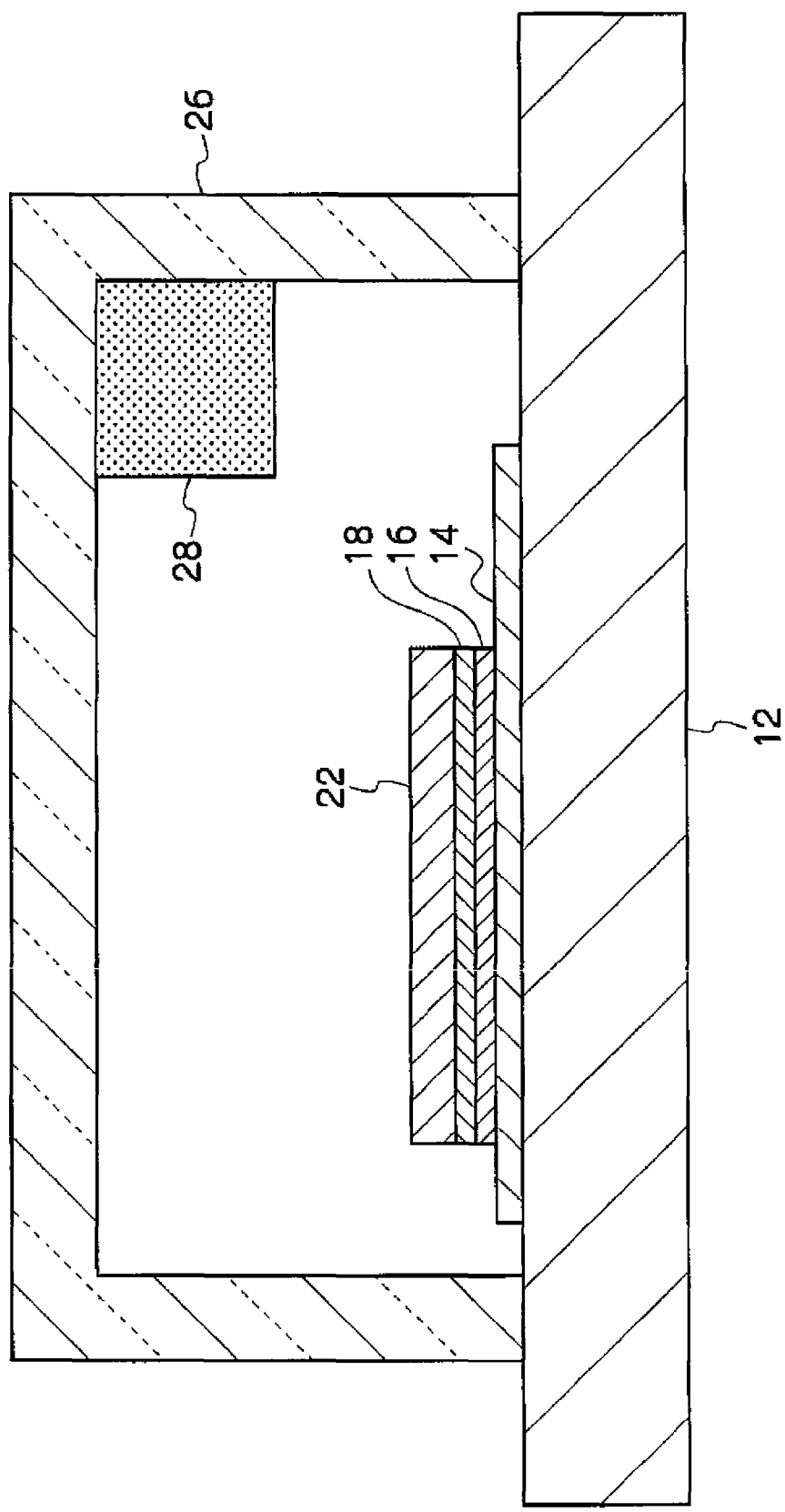
FIG. 6 is a diagrammatic view showing an organic EL panel having a drying agent layer provided on an organic EL device.
Figure 7:
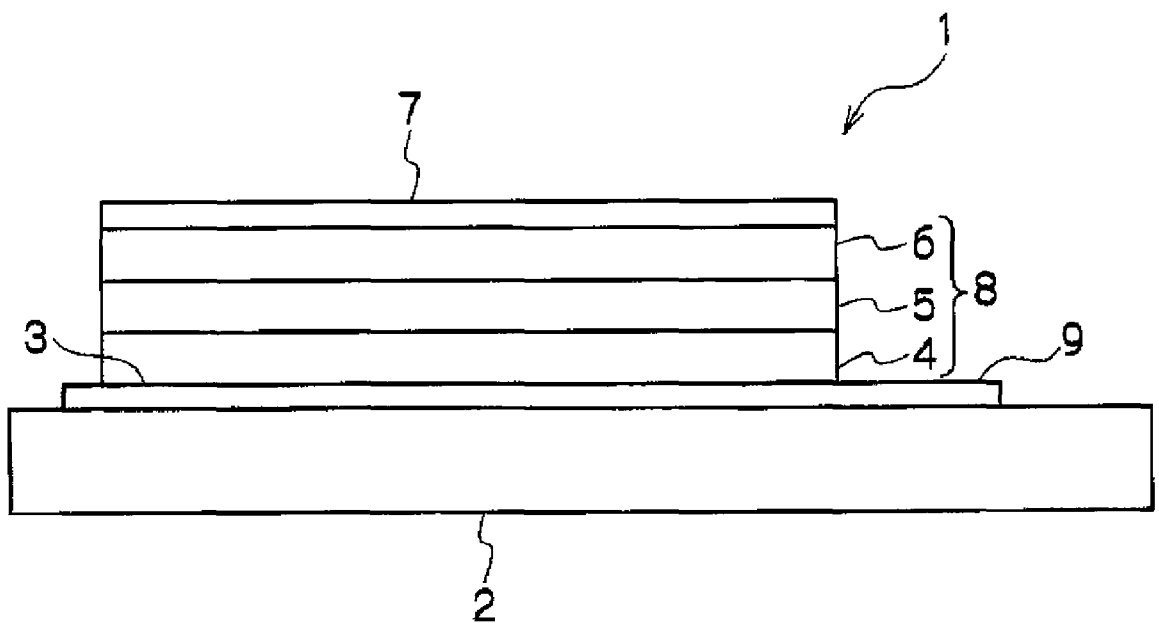
FIG. 7 is a diagrammatic view showing an example of a configuration of an organic EL device.

For example, as illustrated in FIG. 6, in the case where only the drying agent layer 22 is provided on the organic EL device 20, or in the case where only the heat generating layer is provided, even if after commencement of light emission, an effect for reducing the water content in the device is obtained (Line B), when the water content at the commencement of light emission is high, the deterioration of the device easily proceeds.

On the other hand, when the drying agent layer 22 and the heat generating layer 24 are provided as in the invention (Line A), the content of water contained in the organic EL device 20 can be largely reduced due to the heat generation of the heat generating layer 24 and the moisture absorption of the drying agent layer 22 after formation of the device but prior to performing sealing. By performing sealing after reducing the water content in the organic EL device 20 in this way, it is possible to manufacture the organic EL panel 10 whose water content in the organic EL device 20 is extremely low.

After commencement of the light emission, the organic EL device 20 emits light. Therefore, in this case, not only water absorbed in the drying agent layer 22 is positively released due to the heat generation of the heat generating layer 24 and absorbed in the drying agent layer 28 which is located far from the organic EL device 20, but the drying agent layer 22 is recovered.

Figure 3:
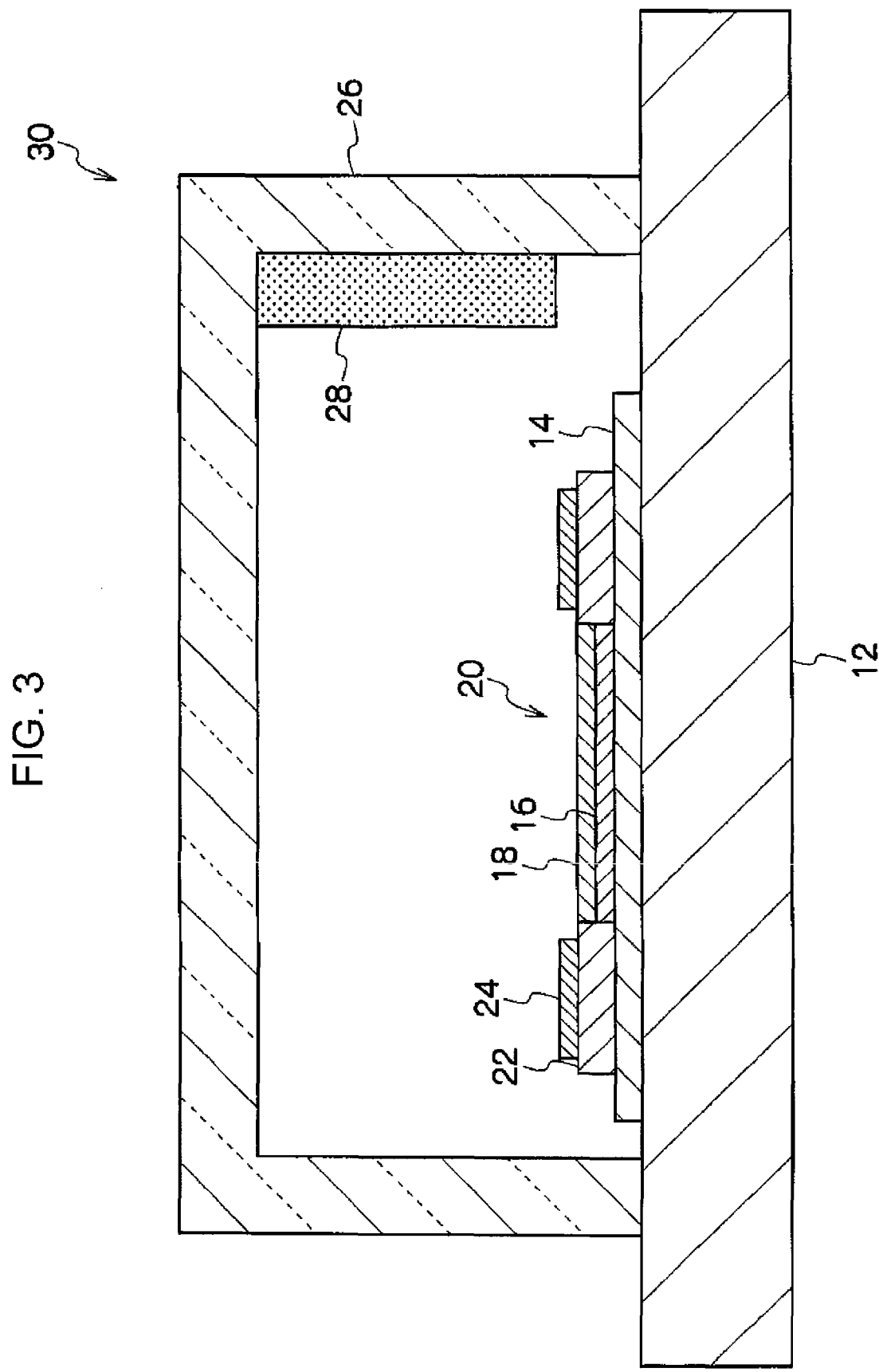
FIG. 3 is a diagrammatic view showing an example (second embodiment) of an organic EL panel according to the invention.
Figure 4:
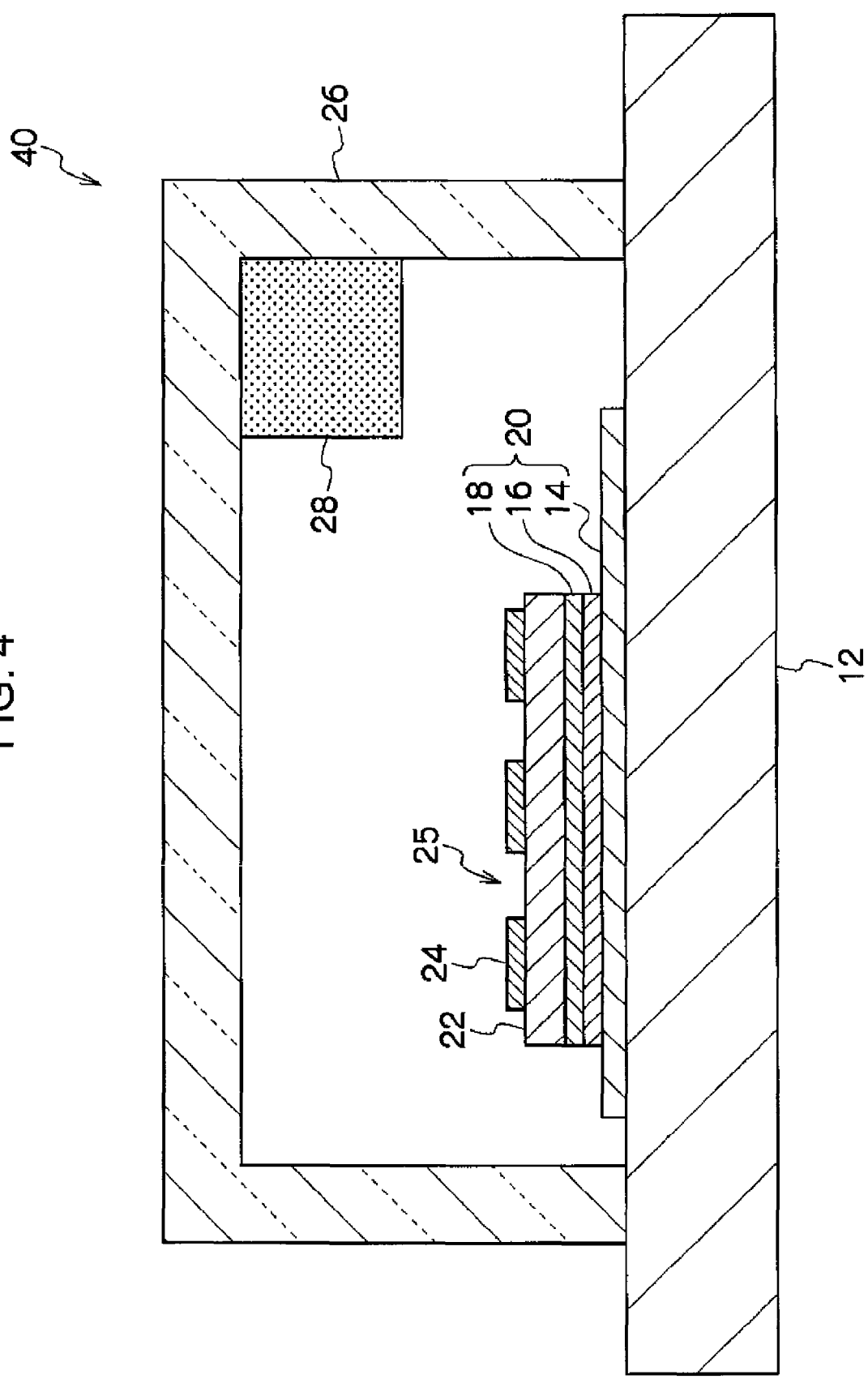
FIG. 4 is a diagrammatic view showing an example (third embodiment) of an organic EL panel according to the invention.
Figure 5:
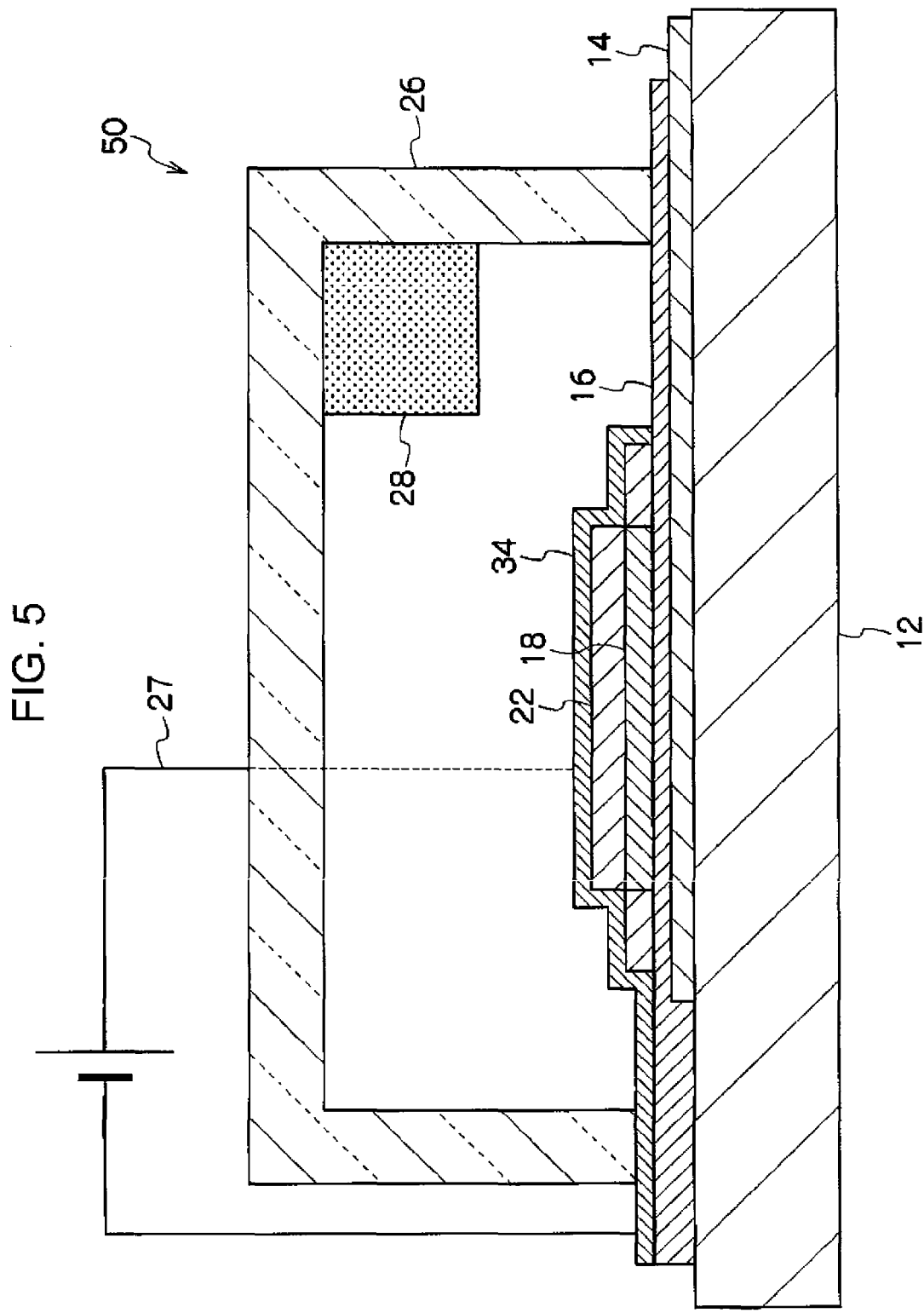
FIG. 5 is a diagrammatic view showing an example (fourth embodiment) of an organic EL panel according to the invention.

FIGS. 3 to 5 illustrate other embodiments of the organic EL panel according to the invention, respectively.

Second Embodiment

In an organic EL panel 30 as illustrated in FIG. 3, the drying agent layer 22 is formed so as to be adjacent to the organic EL layer 16, and the heat generating layer 24 is formed on the drying agent layer 22. Even in such a configuration, not only the drying agent layer 22 is in contact with the organic EL device 20, but the heat generating layer 24 is in contact with the drying agent layer 22. Therefore, the drying agent layer 22 is in a state of being able to positively achieve moisture absorption due to the heat generation of the heat generating layer 24, and water in the organic EL device 20 can be extremely effectively removed.

In this embodiment, the organic EL layer 16 does not overlap with the heat generating layer 24 or the drying agent layer 22. Therefore, for example, even when carbon black is used in the heat generating layer 24, an organic EL panel of a top emission type can be formed without blocking the light emitted from the organic EL layer 16.

Third Embodiment

In an organic EL panel 40 as illustrated in FIG. 4, the drying agent layer 22 is formed on the cathode 18 of the organic EL device 20; and the heat generating layer 24 is formed on the drying agent layer 22 so as to provide openings 25 in such a manner that the drying agent layer 22 is exposed through these openings 25. Even in the organic EL panel 40 having such a configuration, the drying agent layer 22 is in a state of being able to positively achieve moisture absorption of water from the organic EL device 20 due to the heat generation of the heat generating layer 24, and water absorbed in the drying agent layer 22 is easily again released through the openings 25 of the heat generating layer 24. Accordingly, water which has been again released from the drying agent layer 22 is easily and effectively absorbed in another drying agent (second drying agent layer 28) that is separate from the organic EL device 20.

Fourth Embodiment

In an organic EL panel 50 as illustrated in FIG. 5, a heat generating layer 34 which is connected to an external wiring 27 to generate heat due to resistance heating by an electric current is formed. The heat generating layer 34 is formed on the organic EL layer 16 and the drying agent layer 22 for the purpose of avoiding the contact with the electrodes 14 and 18.

Examples of a material to form the heat generating layer 34 capable of generating heat due to resistance heating include high-resistance materials such as an Ni—Cr alloy, a Cu—Ni alloy and an Fe—Cr alloy. The heat generating layer 34 can be formed by using such a material in a vacuum vapor deposition method, a sputtering method, an ion plating method or other methods, Also in the case where the heat generating layer 34 capable of generating heat due to resistance heating is provided as above, the drying agent layer 22 is able to come into a state that water can be positively absorbed from the device side upon heat generation of the heat generating layer 34 by an electric current, thereby enabling realization of a long life of the organic EL panel 50.

While the invention has been described, it should not be construed that the invention is limited to the foregoing embodiments. For example, the organic EL panel according to the invention may be of a passive matrix type or an active matrix type.

Also, the application of the organic EL panel according to the invention is not particularly limited. For example, the organic EL panel according to the invention can be applied to a display in a television receiver, a personal computer, a mobile phone, electronic paper or the like, in addition to illumination apparatus.

Exemplary embodiments of the invention include the following (1) to (15).

(1) An organic EL panel comprising: a substrate; an organic EL device comprising an anode, an organic EL layer and a cathode layered on the substrate; and a sealing member for sealing the organic EL device on the substrate, and further comprising a drying agent layer that contacts the organic EL device, and a heat generating layer that contacts the drying agent layer.

(2) The organic EL panel according to (1), wherein the drying agent layer is formed on the organic EL device.

(3) The organic EL panel according to (1), wherein the drying agent layer comprises two or more drying agents layered on each other.

(4) The organic EL panel according to (1), wherein an opening is formed in the heat generating layer, and the drying agent layer is exposed through the opening.

(5) The organic EL panel according to (1), wherein the heat generating layer generates heat when irradiated with electromagnetic waves.

(6) The organic EL panel according to (1), wherein the heat generating layer generates heat as a result of resistance heating by an electric current.

(7) The organic EL panel according to (1), further comprising a drying agent layer that is separate from the organic EL device in addition to the drying agent layer that contacts the organic EL device.

(8) A method for manufacturing an organic EL panel, comprising forming an organic EL device comprising an anode, an organic EL layer and a cathode layered on a substrate, a drying agent layer in contact with the organic EL device, and a heat generating layer in contact with the drying agent layer; and causing the heat generating layer to generate heat in order to reduce water contained in the organic EL device prior to initial light emission of the organic EL device.

(9) The method according to (8), further comprising forming a sealing member for sealing the organic EL device on the substrate.

(10) The method according to (8), wherein the drying agent layer is formed on the organic EL device.

(11) The method according to (8), wherein the drying agent layer comprises two or more drying agents are layered on each other.

(12) The method according to (8), wherein the heat generating layer is formed so as to have an opening therein such that the drying agent layer is exposed through the opening.

(13) The method according to (8), wherein the heat generating layer generates heat when irradiated with electromagnetic waves.

(14) The method according to (8), wherein the heat generating layer generates heat as a result of resistance heating by an electric current.

(15) The method according to (8), further comprising forming a drying agent layer that is separate from the organic EL device in addition to the drying agent layer in contact with the organic EL device.

According to the invention, an organic EL panel with long life in which water in an organic EL device can be positively absorbed to effectively inhibit the deterioration of the organic EL device to keep stable light-emitting characteristics, and a method for manufacturing the organic EL panel are provided.

What is claimed is:

1. An organic EL panel comprising: a substrate; an organic EL device comprising an anode, an organic EL layer and a cathode layered on the substrate; and a sealing member for sealing the organic EL device on the substrate, and further comprising a drying agent layer that contacts the organic EL device, and a heat generating layer that contacts the drying agent layer,
wherein an opening is formed in the heat generating layer, and the drying agent layer is exposed through the opening.

2. The organic EL panel according to claim 1, wherein the drying agent layer is formed on the organic EL device.

3. The organic EL panel according to claim 1, wherein the drying agent layer comprises two or more drying agents layered on each other.

4. The organic EL panel according to claim 1, wherein the heat generating layer generates heat when irradiated with electromagnetic waves.

5. The organic EL panel according to claim 1, wherein the heat generating layer generates heat as a result of resistance heating by an electric current.

6. The organic EL panel according to claim 1, further comprising a drying agent layer that is separate from the organic EL device in addition to the drying agent layer that contacts the organic EL device.

7. A method for manufacturing an organic EL panel, comprising forming an organic EL device comprising an anode, an organic EL layer and a cathode layered on a substrate, a drying agent layer in contact with the organic EL device, and a heat generating layer in contact with the drying agent layer; and causing the heat generating layer to generate heat in order to reduce water contained in the organic EL device prior to initial light emission of the organic EL device, wherein the heat generating layer is formed so as to have an opening therein such that the drying agent layer is exposed through the opening.

8. The method according to claim 7, further comprising forming a sealing member for sealing the organic EL device on the substrate.

9. The method according to claim 7, wherein the drying agent layer is formed on the organic EL device.

10. The method according to claim 7, wherein the drying agent layer comprises two or more drying agents are layered on each other.

11. The method according to claim 7, wherein the heat generating layer generates heat when irradiated with electromagnetic waves.

12. The method according to claim 7, wherein the heat generating layer generates heat as a result of resistance heating by an electric current.

13. The method according to claim 7, further comprising forming a drying agent layer that is separate from the organic EL device in addition to the drying agent layer in contact with the organic EL device.

* * * * *